(12) United States Patent
Kim et al.

(10) Patent No.: US 6,720,580 B2
(45) Date of Patent: Apr. 13, 2004

(54) LIQUID CRYSTAL DISPLAY DEVICE AND METHOD OF FORMING THE SAME

(75) Inventors: Dong Guk Kim, Kyounggi-do (KR); Dong Hoon Lee, Kyounggi-do (KR); Youn Gyoung Chang, Kyounggi-do (KR)

(73) Assignee: LG. Phillips LCD Co., Ltd., Seoul (KR)

( * ) Notice: Subject to any disclaimer, the term of this patent is extended or adjusted under 35 U.S.C. 154(b) by 0 days.

(21) Appl. No.: 10/067,507

(22) Filed: Feb. 7, 2002

(65) Prior Publication Data

US 2002/0109141 A1 Aug. 15, 2002

(30) Foreign Application Priority Data

Feb. 9, 2001 (KR) ......................................... P2001-6516

(51) Int. Cl.[7] ....................... H01L 29/04; H01L 31/036; G02F 1/136; G02F 1/1343
(52) U.S. Cl. .......................... 257/72; 257/59; 257/440; 349/42; 349/139; 349/143; 349/144; 349/145; 349/146
(58) Field of Search ............................ 257/72, 59, 440; 349/42, 139, 143–146

(56) References Cited

U.S. PATENT DOCUMENTS

| | | | | |
|---|---|---|---|---|
| 5,515,187 A | * | 5/1996 | Nakamura et al. | 349/42 |
| 5,521,729 A | * | 5/1996 | Ukai et al. | 349/42 |
| 5,614,728 A | * | 3/1997 | Akiyama | 257/57 |
| 5,897,182 A | * | 4/1999 | Miyawaki | 349/43 |
| 6,226,057 B1 | * | 5/2001 | Lee | 349/38 |
| 6,335,211 B1 | * | 1/2002 | Lee | 438/22 |
| 6,392,733 B1 | * | 5/2002 | Gregory | 349/146 |
| 6,403,980 B1 | * | 6/2002 | Park | 257/59 |
| 6,441,873 B2 | * | 8/2002 | Young | 349/43 |
| 2001/0019320 A1 | * | 9/2001 | Lee et al. | 345/87 |

* cited by examiner

Primary Examiner—Mary Wilczewski
Assistant Examiner—Ida M. Soward
(74) Attorney, Agent, or Firm—Morgan, Lewis & Bockius LLP

(57) ABSTRACT

A liquid crystal display device includes a plurality of gate lines on a substrate, a plurality of data lines on the substrate orthogonal to the plurality of gate lines to define a plurality of pixel regions, at least one thin film transistor at crossing points of the plurality of gate lines and the plurality of data lines, a passivation film on a surface of the substrate and the at least one thin film transistor, and a pixel electrode connected to the at least one thin film transistor, wherein corners of the pixel electrode are arcuate shaped such that a distance between adjacent corners of adjacent pixel electrodes is larger than a distance between adjacent contact sides of the adjacent pixel electrodes.

10 Claims, 7 Drawing Sheets

LIQUID CRYSTAL DISPLAY DEVICE AND METHOD OF FORMING THE SAME

The present invention claims the benefit of Korean Patent Application No. P2001-6516 filed in Korea on Feb. 9, 2001, which is hereby incorporated by reference.

BACKGROUND OF THE INVENTION

1. Field of the Invention

The present invention relates to a liquid crystal display (LCD) device, and more particularly, to an LCD device having a high aperture ratio.

2. Discussion of the Related Art

Generally, LCD devices are classified as one of two different types: a transmitting type LCD device and a reflective type LCD device. The transmitting type LCD device has a backlight to serve as a light source, thereby the transmitting type LCD device can display a picture image in low light surroundings. However, the transmitting type LCD device is problematic in that it requires a high power consumption. The reflective type LCD device makes use of ambient light as a light source, thereby requiring a relatively small amount of power consumption. However, the reflective type LCD device is problematic in that it cannot display a picture image in low light surroundings.

To solve the problems of both the transmitting and reflective type of LCD devices, a transflective LCD device is presented. The transflective LCD device can be used as a reflective type or a transmitting type of LCD device as needed since the transflective LCD device has both a reflective part and a transmitting part inside unit pixel region. That is, the transflective LCD device may operate as the reflective LCD device by reflecting of ambient light incident through an upper substrate when the ambient light is sufficient to display an image, and the transflective LCD device may operate as the transmitting LCD device by transmitting light from a backlight source to a liquid crystal layer through an opening part of a reflective electrode when the ambient light is insufficient to display an image. Presently, in order to provide the ambient light to the reflective electrode an area of the reflective or the transflective electrode is increased, thereby increasing an aperture ratio of the transflective LCD device.

FIG. 1A is a plan view of an LCD device according to the related art. FIG. 1B is a sectional view of the LCD device according to the related art along I–I' of FIG. 1A. In general, the LCD device includes a TFT substrate as a lower substrate, a color filter substrate as an upper substrate, and a liquid crystal layer between the lower and upper substrates.

In FIGS. 1A and 1B, the TFT substrate includes gate lines 2 and data lines 5, a TFT, and a pixel electrode 7. The gate lines 2 and the data lines 5 are formed on the lower substrate 1 to cross each other, thereby defining a pixel region. Then, the TFT is formed at a crossing point of the gate lines 2 and the data lines 5, and the pixel electrode 7 is electrically connected with the TFT. In addition, the pixel electrode 7 occupies most of the area in the unit pixel region. The TFT includes a gate electrode 2a, a semiconductor film 4, a source electrode 5a, and a drain electrode 5b.

A method for manufacturing the LCD device according to the relate art will be described in detail.

A low-resistance conductive metal is deposited on the lower substrate 1 by sputtering processes, and then the gate line 2 and the gate electrode 2a are formed on the lower substrate by photolithographic processes. A gate insulating film 3 is formed on an entire surface of the lower substrate including the gate line 2, and then the semiconductor film 4 is formed above the gate electrode 2a. Then, a low resistance metal is deposited on the entire surface of the lower substrate including the gate insulating film 3, and then the data line 5 and the source/drain electrodes 5a and 5b are formed by photolithography.

The data line 5 crosses the gate line 2 to define the unit pixel region, and the source/drain electrodes 5a and 5b are formed on the semiconductor film 4, thereby forming the TFT. Subsequently, a passivation film 6 is formed on the entire surface of the lower substrate including the TFT at a predetermined depth, and the pixel electrode 7 formed on the passivation film 6 is electrically connected with the drain electrode 5b through a contact hole. Accordingly, if the pixel electrode 7 is formed of transparent conductive material such as ITO, the LCD device is formed as the transmitting type. If the pixel electrode 7 is formed of high reflective metal such as Al and Cu, the LCD device is formed as the reflective type. In addition, if the pixel electrode 7 includes a reflective part and a transmitting part, and then a reflective electrode of high reflectivity is formed in the reflective part, and a transmitting electrode connected with the reflective electrode is formed in the transmitting part, whereby the transflective LCD device is formed.

The pixel electrode is patterned by photolithographic and wet etching processes. As shown in FIG. 1A, a remaining portion 7a of the pixel electrode is not completely removed in regions where material has to be removed during the wet etch, thereby creating an electrical pathway to electrically short adjacent pixel electrodes. The electrical pathway between the adjacent pixel electrodes is caused by a depth of the pixel electrode, condition of the wet etch, and overlap degree between the data and gate lines. Specifically, the pixel electrode is maximized in the unit pixel region to maximize the area of the unit pixel electrode, so that the pixel electrode is close to the adjacent pixel electrode. Therefore, the electrical short between the pixel electrodes is likely to occur.

In case of patterning the reflective electrode as the pixel electrode, any remaining portion of the material for forming the reflective electrode resulting from wet etch processing will be greater than in case of patterning the transmitting electrode as the pixel electrode since the reflective electrode is thicker than the transmitting electrode. Accordingly, in a case of a transistor of a 12.1" SVGA, the reflective electrode is formed at a depth from 2000 Å to 3000 Å. In addition, if a minimum distance between the reflective electrodes of the adjacent pixels is about 7 μm, an average total number of electrical pathways generated in one unit substrate is 50 to 70, thereby generating associated defects in 100 unit pixels of the unit substrate. Moreover, the electrical pathway is not removed even though the reflective electrode is sufficiently etched until light leakage generates between the pixel electrodes.

Accordingly, the related art LCD device according to the related art has the following problems. First, since each pixel electrode has to obtain a maximum area within the unit pixel region to increase aperture ratio and reflectivity, electrical shorts are generated between the pixel electrodes, thereby degrading the display quality. Accordingly, if the distance between the adjacent pixel electrodes is reduced, then predetermined corners of the pixel electrode are not etched. Therefore, it is not possible to independently drive the unit pixel electrode. This problem is easily generated when using the reflective electrode as the pixel electrode verses when using the transmitting electrode as the pixel electrode, since the reflective electrode is thicker than the transmitting electrode. Additionally, line width can be reduced by forming the conductive lines of low resistance materials, thereby the distance between the adjacent pixel electrodes becomes shorter resulting in the generation of electrical shorts.

SUMMARY OF THE INVENTION

Accordingly, the present invention is directed to a liquid crystal display device and a method of forming a liquid crystal display device that substantially obviates one or more problems due to limitations and disadvantages of the related art.

An object of the present invention is to provide an liquid crystal display device and a method of forming a liquid crystal display device having a high aperture ratio, and for preventing the generating of electrical shorts between adjacent pixel electrodes by rounding corners of each pixel electrode.

Additional advantages, objects, and features of the invention will be set forth in part in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a liquid crystal display device includes a plurality of gate lines on a substrate, a plurality of data lines on the substrate orthogonal to the plurality of gate lines to define a plurality of pixel regions, at least one thin film transistor at crossing points of the plurality of gate lines and the plurality of data lines, a passivation film on a surface of the substrate and the at least one thin film transistor, and a pixel electrode connected to the at least one thin film transistor, wherein corners of the pixel electrode are arcuate shaped such that a distance between adjacent corners of adjacent pixel electrodes is larger than a distance between adjacent contact sides of the adjacent pixel electrodes.

In another aspect, a liquid crystal display device includes a plurality of gate lines on a substrate, a plurality data lines on the substrate orthogonal to the plurality of gate lines to define a plurality of pixel regions, at least one thin film transistor at crossing points of the plurality of gate lines and the plurality of data lines, a passivation film on a surface of the substrate and the at least one thin film transistor, a first pixel electrode electrically connected to the at least one thin film transistor via a contact hole in the passivation film, the first pixel electrode having arcuate shaped corners such that a distance between corners of adjacent pixel electrodes is larger than adjacent contact sides of the adjacent pixel electrodes, and a second pixel electrode formed on the first pixel electrode, the second pixel electrode having arcuate shaped corners such that a distance between the corners of the adjacent pixel electrodes is larger than the adjacent contact sides of the adjacent pixel electrodes.

In another aspect, a method of forming a liquid crystal display device includes forming a plurality of gate lines on a substrate, forming a plurality of data lines on the substrate orthogonal to the plurality of gate lines to define a plurality of pixel regions, forming at least one thin film transistor at crossing points of the plurality of gate lines and the plurality of data lines, forming a passivation film on a surface of the substrate and the at least one thin film transistor, and forming a pixel electrode connected to the at least one thin film transistor, wherein corners of the pixel electrode are arcuate shaped such that a distance between corners of adjacent pixel electrodes is larger than a distance between adjacent contact sides of the adjacent pixel electrodes.

In another aspect, a method of forming a liquid crystal display device includes forming a plurality of gate lines on a substrate, forming a plurality data lines on the substrate orthogonal to the plurality of gate lines to define a plurality of pixel regions, forming at least one thin film transistor at crossing points of the plurality of gate lines and the plurality of data lines, forming a passivation film on a surface of the substrate and the at least one thin film transistor, forming a first pixel electrode electrically connected to the at least one thin film transistor via a contact hole in the passivation film, the first pixel electrode having arcuate shaped corners such that a distance between corners of adjacent pixel electrodes is larger than a distance between contact sides of the adjacent pixel electrodes, and forming a second pixel electrode formed on the first pixel electrode, the second pixel electrode having arcuate shaped corners such that a distance between the corners of the adjacent pixel electrodes is larger than a distance between the contact sides of the adjacent pixel electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1A:
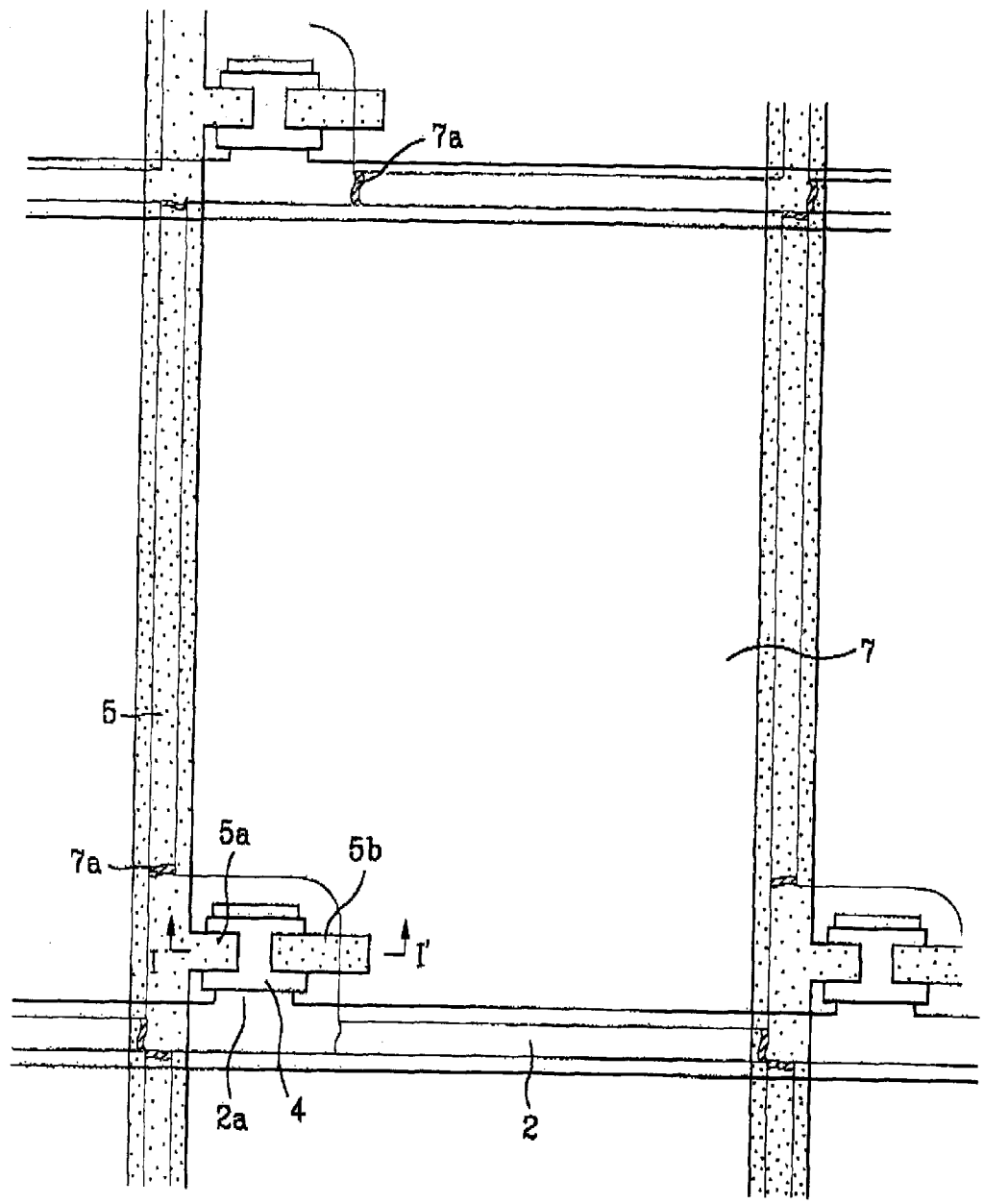
FIG. 1A is a plan view of a reflective LCD device according to the related art.
Figure 1B:
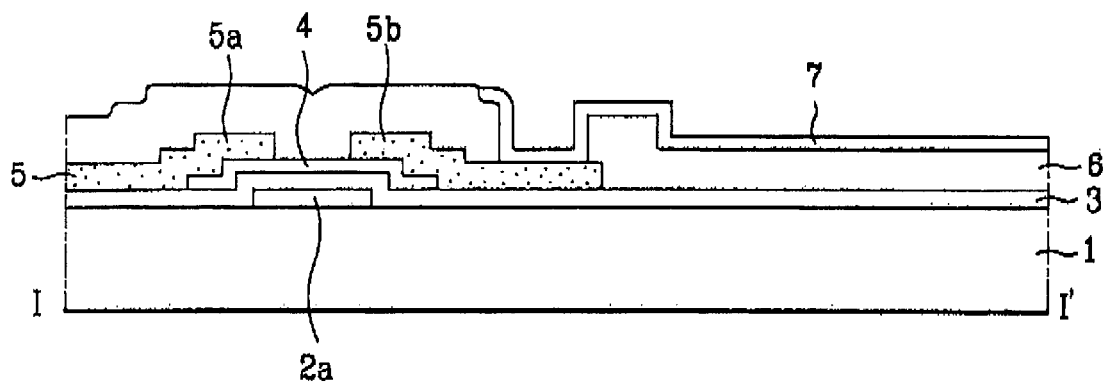
FIG. 1B is a cross sectional view of the reflective LCD device according to the related art along I–I' of FIG. 1A.
Figure 2A:
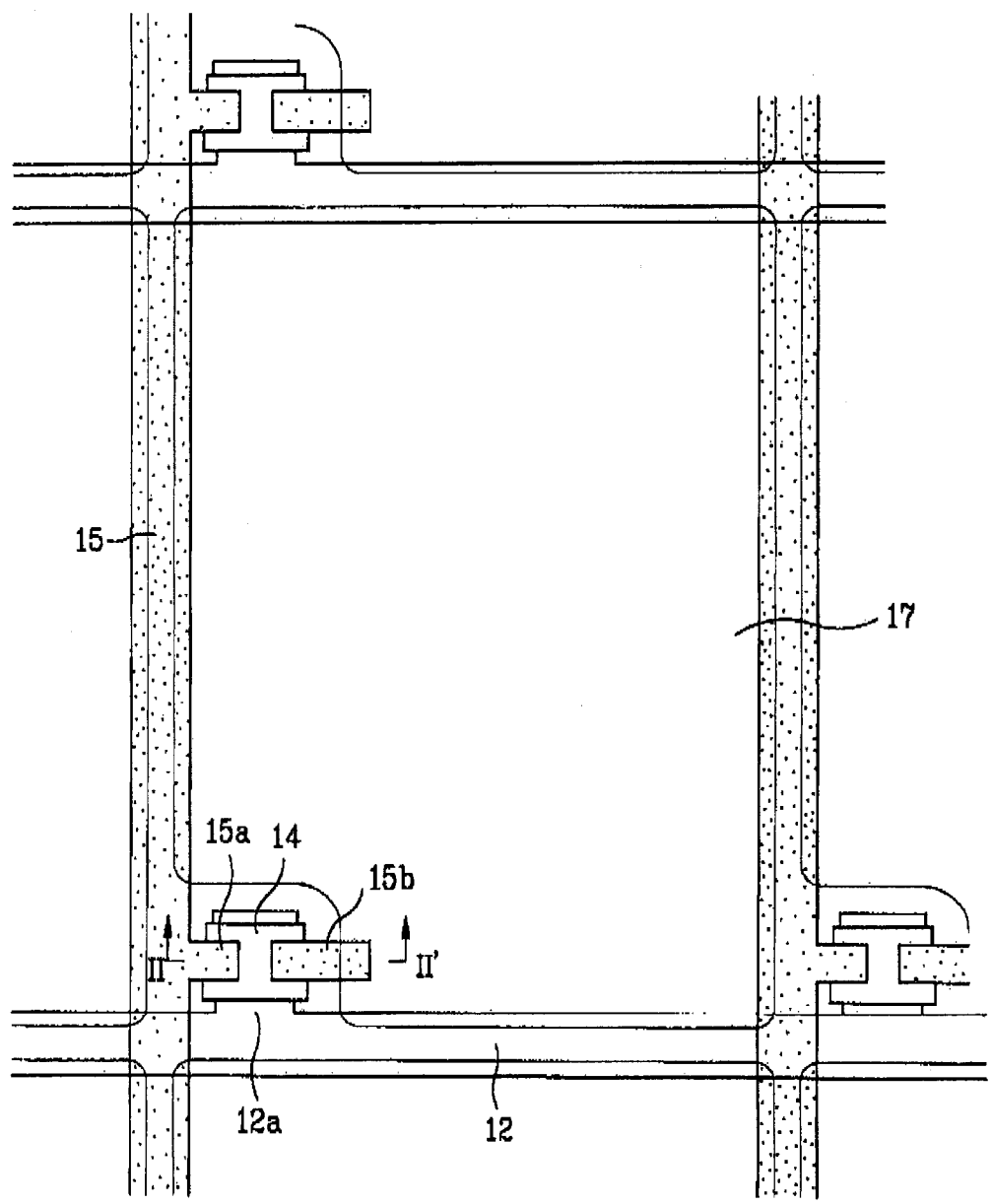
FIG. 2A is a plan view of an exemplary reflective LCD device according to the present invention.
Figure 2B:
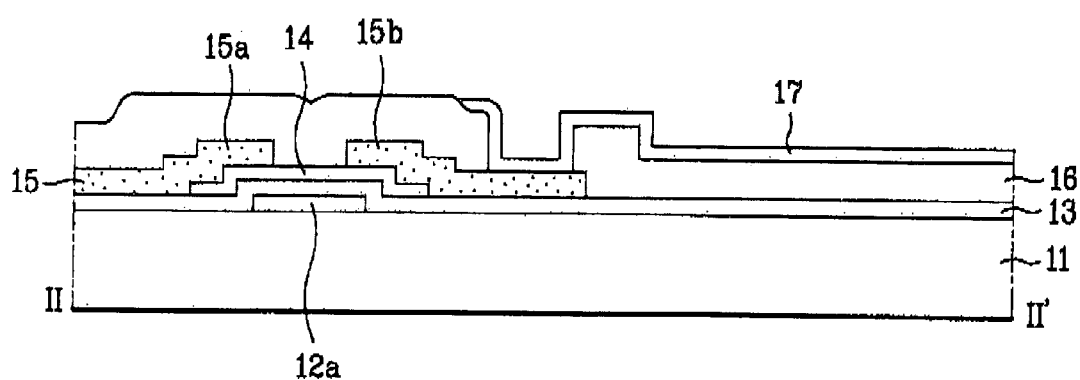
FIG. 2B is a cross sectional view of the exemplary reflective LCD device according to the present invention along II–II' of FIG. 2A.

FIG. 2A is a plan view of an exemplary reflective LCD device according to the present invention, and FIG. 2B is a cross sectional view of the exemplary reflective LCD device of the present invention along II–II' of FIG. 2A. In FIGS. 2A and 2B, a lower substrate of the reflective LCD device of the present invention may include gate lines 12 and data lines 15, a TFT, a passivation film 16, and a reflective/pixel electrode 17.

The gate lines 12 and the data lines 15 may be formed to cross to each other in a matrix type, thereby defining a pixel region. The TFT may be formed at a crossing point of the gate lines 12 and the data lines 15 by depositing, for example, a gate electrode 12a, a gate insulating film 13, a semiconductor film 14, a source electrode 15a, and a drain electrode 15b. Then, the passivation film 16 may be formed on an entire surface of the lower substrate including the TFT, and the reflective/pixel electrode 17 may be electrically connected with the drain electrode 15b. Corner regions of the reflective/pixel electrode 17 may be rounded by patterning, for example, so that any residual material that may remain in corner regions of the reflective/pixel electrode 17 during processing can be easily removed and a distance between corners of adjacent reflective/pixel electrodes 17 can be increased, thereby preventing generation of electrical pathways that may electrically short the adjacent reflective/pixel electrodes 17.

An exemplary method for manufacturing the reflective LCD device according the present invention will be described in detail.

The plurality of gate electrodes 12a and the plurality of gate lines 12 may be formed on the lower substrate 11. Then, the gate insulating film 13 may be formed on the entire surface of the lower substrate including the gate lines 12. The semiconductor film 14 may be formed above the gate electrode 12a by a plasma enhanced chemical vapor deposition process, for example, using amorphous silicon (PECVD).

Subsequently, the plurality of data lines 15 may be formed to cross the plurality of the gate lines 12, thereby defining unit pixel region. In addition, the TFT may be simultaneously formed by forming the source electrode 15a and the drain electrode 15b on the semiconductor film 14. A low resistance metal such as Cr, Mo, Al, Sn or Cu, for example may be deposited by a sputtering process, and patterned by a photolithographic process, for example, thereby forming the gate lines 12, the gate electrodes 12a, the data lines 15, and the source and drain electrodes 15a and 15b.

Then, the passivation film 16 may be formed on the entire surface of the lower substrate 11 including the TFT, and the reflective/pixel electrode 17 may be electrically connected with the drain electrode 15b of the TFT by a photolithographic process, for example. The gate insulating film 13 or the passivation film 16 may be formed of an inorganic insulating material such as silicon nitride film and silicon oxide film, for example, or may be formed on an organic film using benzocyclobutene (BCB) or acryl resin, for example.

The reflective/pixel electrode 17 may be formed in a maximum area of a high reflective metal such as Al alloy or Ti, for example, to effectively reflect external light, and may be formed to overlap the gate line 12 or the data line 15, thereby preventing light from leaking. To prevent electrical shorts from generating between adjacent reflective/pixel electrodes 17, the corners of the reflective/pixel electrodes 17 may be completely or selectively rounded. Accordingly, if the transmitting electrode using the transparent conductive material is used instead of the reflective/pixel electrode 17, the LCD device according to the present invention is formed as a transmitting LCD device.

Figure 3A:
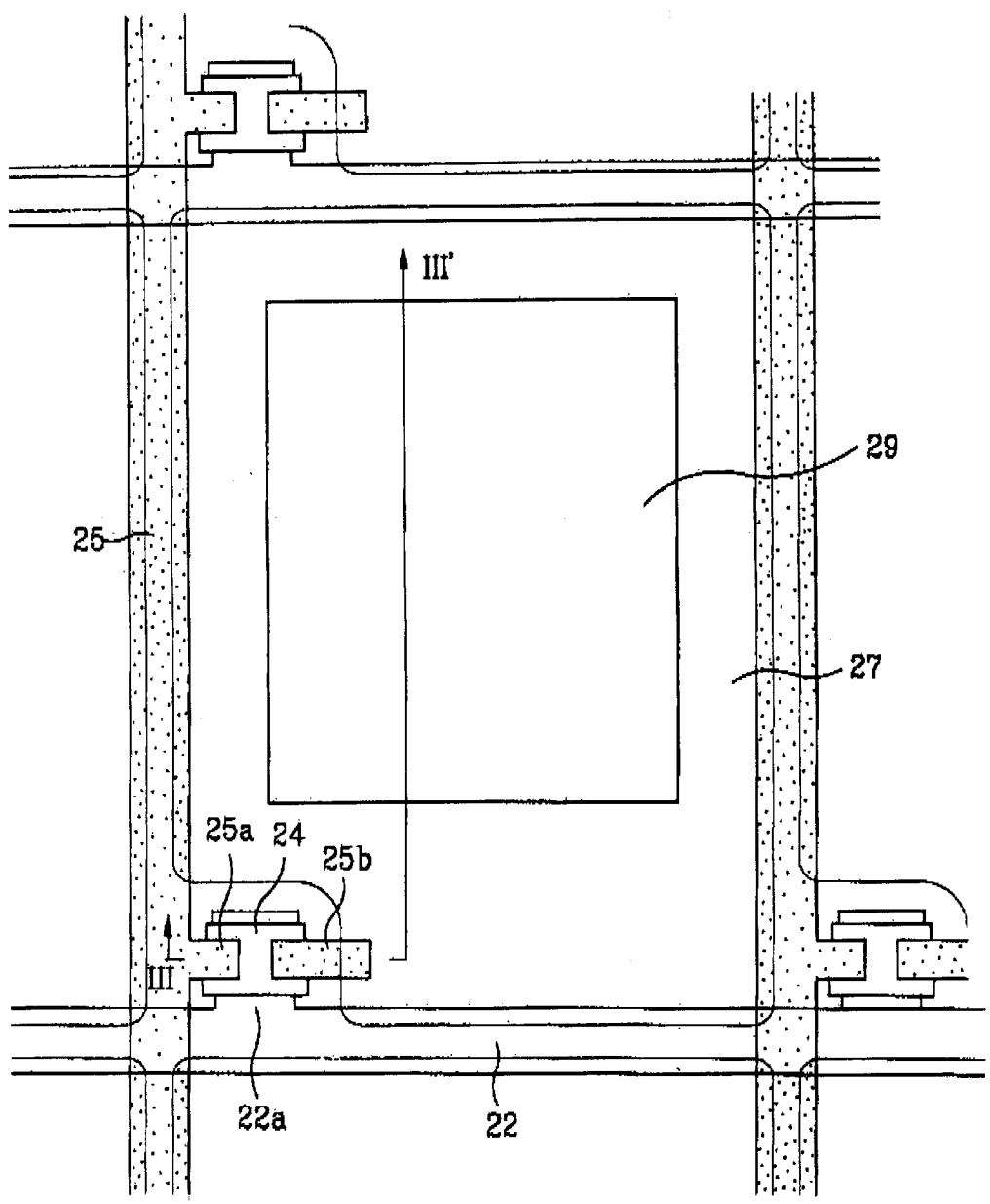
FIG. 3A is a plan view of an exemplary transflective LCD device according to the present invention.
Figure 3B:
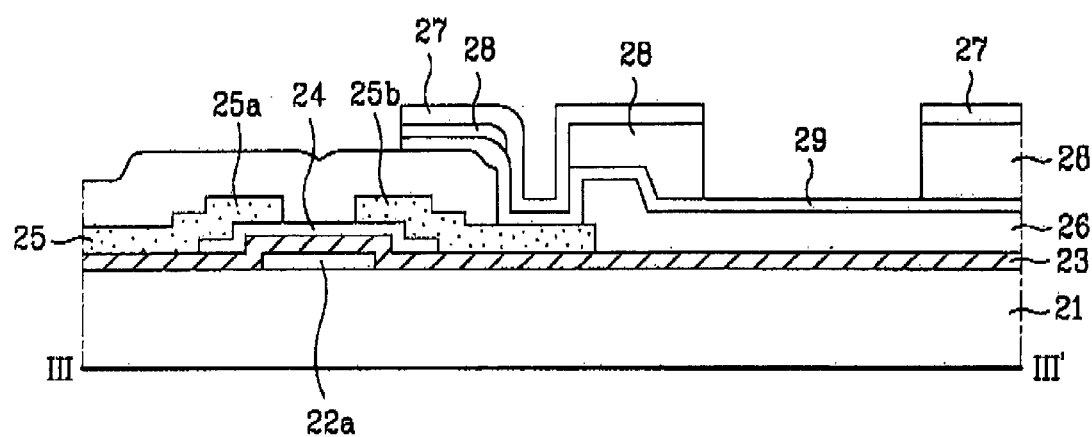
FIG. 3B is a cross sectional view of the exemplary transflective LCD device according to the present invention along III–III' of FIG. 3A.

In FIGS. 3A and 3B, in the transflective LCD device according to the present invention, a plurality of gate lines 22 may be formed on a lower substrate 11 to be parallel to the lower substrate 11, and gate electrodes 22a electrically connected with the gate lines 22 may be formed at regions for forming TFTs. A gate insulating film 23 may be formed to electrically insulate the gate line 22 and the gate electrode 22a from subsequently formed upper layers, and data lines 25 may be formed on the gate insulating film 23 in a matrix type with the gate lines 22. Then, a material with which the data line 25 is formed may be deposited and patterned, for example, to form source electrodes 25a and drain electrodes 25b. A semiconductor film 24 may be formed below the source and drain electrodes 25a and 25b, and a first passivation film 26 may be deposited on an entire surface of the lower substrate 11 including the semiconductor film 24 and source/drain electrodes 25a and 25b. Then, a transmitting electrode 29 electrically connected to the drain electrode 25b may be formed on the passivation film 26 through a contact hole. A reflective electrode 27 having rounded corners may be formed in a reflective part on the reflective electrode 27 to prevent an electrical short from being generating, which is electrically connected to the transmitting electrode 29 through the contact hole. A second passivation film 28 may be formed between the transmitting electrode 29 and the reflective electrode 27 to insulate the reflective electrode 27 from the transmitting electrode 29.

The transmitting electrode 29 may be formed after forming the reflective electrode 27. The reflective electrode 27 may be formed in a vicinity of the pixel region, and the transmitting electrode 29 may be formed in a center portion of the pixel region. The transmitting electrode 29 may be formed of a transparent conductive material such as an indium tin oxide (ITO), for example, and the reflective electrode 27 may be formed of a metal having a high reflectivity such as Al, Al alloy, or Ti, for example. The second passivation film 28 may function as an insulating film and may be formed of BCB or acryl resin, for example. In addition, a portion of the second passivation film 28 located between the reflective electrode 27 and the transmitting electrode 29 may be removed.

As previously described, if the corners of the pixel electrode are round, and a distance between adjacent pixel electrodes is minimized in order to maximize an area of the pixel electrode, an electrical short generated in the pixel electrode due to residual material generated during wet etch may be prevented. Accordingly, the pixel electrode may be independently driven, and the area of the pixel electrode may be maximized, thereby increasing an aperture ratio. In addition, patterning the corners of the pixel electrode may include various forms in order to prevent generation of an electrical short and to prevent significant reduction in an area of the reflective electrode. Furthermore, the distance between adjacent pixel electrodes, the depth of the pixel electrodes, a wet etching and patterning processes all may be considered when determining what form the corners will take in order to prevent the generation of electrical shorting between the adjacent pixel electrodes.

Figure 4:
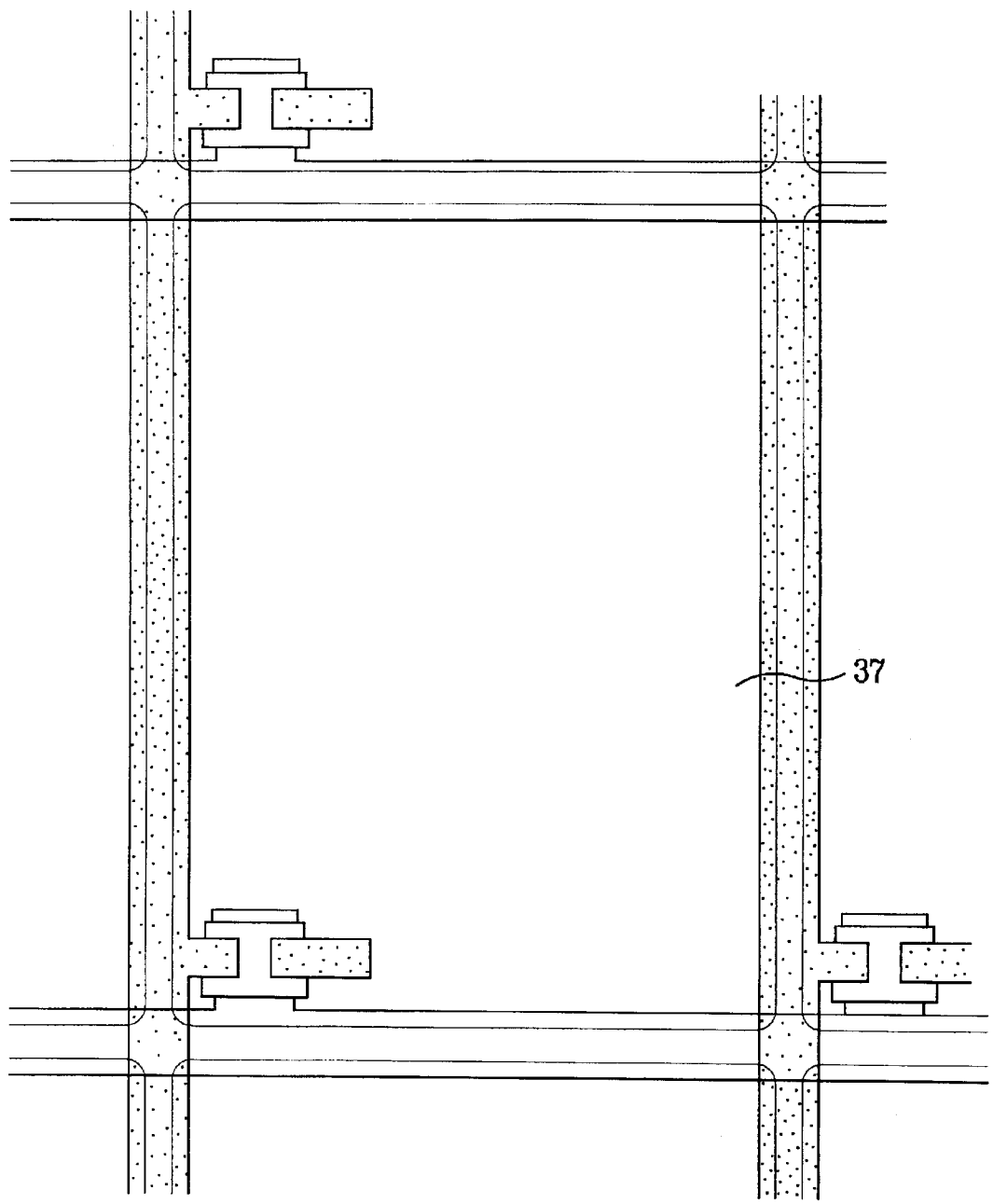
FIG. 4 is a plan view of an exemplary reflective LCD device according to the present invention.

FIG. 4 is a plan view of an exemplary reflective LCD device according to the present invention. In FIG. 4, the reflective electrode 37 may be extended to cover the TFT. Therefore, light leakage may be prevented from being generating in the TFT, thereby increasing the area of the reflective electrode 37 and improving the aperture ratio. However, the transmitting electrode may not be effective in the present invention. Accordingly, the present invention may be applied to the reflective and transflective LCD devices using the reflective electrode. In addition, the passivation film may include an organic insulating film formed between the reflective electrode and the TFT, thereby preventing a problem generated by the reflective electrode and the TFT being overlapped.

The LCD device according to the present invention has the following advantages. First, the corners of each pixel electrode may be selectively rounded, so that it is possible to prevent electrical shorts from being generates in the pixel electrodes, thereby obtaining a high aperture ratio and high resolution in the LCD device. In addition, in the reflective LCD device and the transflective LCD device, the areas of the reflective electrodes are maximized, thereby obtaining a high reflectivity in the LCD device. Furthermore, a distance between adjacent pixel electrodes can be minimized even though a width of the conductive lines is reduced, so that it is possible to use low resistance lines without shorts. Accordingly, display quality of the LCD device can be improved.

It will apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:

a plurality of gate lines on a substrate;

a plurality of data lines on the substrate orthogonal to the plurality of gate lines to define a plurality of pixel regions;

at least one thin film transistor at crossing points of the plurality of gate lines and the plurality of data lines;

a passivation film on a surface of the substrate and the at least one thin film transistor; and a pixel electrode connected to the at least one thin film transistor, wherein corners of the pixel electrode are arcuate shaped such that a distance between adjacent corners of adjacent pixel electrodes is larger than a distance between adjacent contact sides of the adjacent pixel electrodes.

2. The device according to claim 1, wherein the corners of the pixel electrode are rounded.

3. The device according to claim 1, wherein the pixel electrode overlaps an edge surface of at least one of the plurality of gate lines and one of the plurality of data lines.

4. The device according to claim 1, wherein the pixel electrode is transparent.

5. The device according to claim 1, wherein the pixel electrode is reflective.

6. The device according to claim 5, wherein the pixel electrode overlaps the at least one thin film transistor.

7. A liquid crystal display device, comprising:

a plurality of gate lines on a substrate;

a plurality data lines on the substrate orthogonal to the plurality of gate lines to define a plurality of pixel regions;

at least one thin film transistor at crossing points of the plurality of gate lines and the plurality of data lines;

a passivation film on a surface of the substrate and the at least one thin film transistor;

a first pixel electrode electrically connected to the at least one thin film transistor via a contact hole in the passivation film, the first pixel electrode having arcuate shaped corners such that a distance between corners of adjacent pixel electrodes is larger than adjacent contact sides of the adjacent pixel electrodes; and a second pixel electrode formed on the first pixel electrode, the second pixel electrode having arcuate shaped corners such that a distance between the corners of the adjacent pixel electrodes is larger than the adjacent contact sides of the adjacent pixel electrodes.

8. The device according to claim 7, wherein the corners of first pixel electrode and the second pixel electrode are rounded.

9. The device according to claim 7, wherein an insulating film is interposed between the first pixel electrode and the second pixel electrode.

10. The device according to claim 7, wherein the second pixel electrode includes at least one of Al, Mo, and Ti.

* * * * *